US010602624B2

(12) United States Patent
Tyagi et al.

(10) Patent No.: US 10,602,624 B2
(45) Date of Patent: Mar. 24, 2020

(54) CUMULATIVE SENSOR IN A FOLDABLE DEVICE

(71) Applicant: Motorola Mobility LLC, Chicago, IL (US)

(72) Inventors: Vivek Kumar Tyagi, Chicago, IL (US); Scott Patrick DeBates, Crystal Lake, IL (US); Douglas Alfred Lautner, Round Lake, IL (US)

(73) Assignee: Motorola Mobility LLC, Chicago, IL (US)

( * ) Notice: Subject to any disclaimer, the term of this patent is extended or adjusted under 35 U.S.C. 154(b) by 65 days.

(21) Appl. No.: 15/982,858

(22) Filed: May 17, 2018

(65) Prior Publication Data

US 2019/0357365 A1    Nov. 21, 2019

(51) Int. Cl.
*H05K 5/00*   (2006.01)
*G06F 3/0488* (2013.01)
*H05K 5/02*   (2006.01)
*H05K 1/02*   (2006.01)

(52) U.S. Cl.
CPC ....... *H05K 5/0017* (2013.01); *G06F 3/04883* (2013.01); *H05K 1/028* (2013.01); *H05K 5/0226* (2013.01); *H05K 5/0247* (2013.01); *G06F 2203/04808* (2013.01)

(58) Field of Classification Search
CPC .... H05K 5/0017; H05K 1/028; H05K 5/0226; H05K 5/0247; G06F 3/04883; G06F 2203/04808
See application file for complete search history.

(56) References Cited

U.S. PATENT DOCUMENTS

| 2016/0187994 | A1* | 6/2016 | La | G06F 1/1652 345/619 |
|---|---|---|---|---|
| 2016/0357318 | A1 | 12/2016 | Chan et al. | |
| 2018/0129250 | A1 | 5/2018 | La et al. | |
| 2018/0285047 | A1* | 10/2018 | Jeune | G06F 3/1423 |
| 2018/0342226 | A1* | 11/2018 | Shin | G06F 3/0487 |

FOREIGN PATENT DOCUMENTS

EP    2977850    1/2016

OTHER PUBLICATIONS

"International Search Report and Written Opinion", Application No. PCT/US2019/021899, dated Jul. 15, 2019, 15 pages.

* cited by examiner

*Primary Examiner* — Temesghen Ghebretinsae
*Assistant Examiner* — Ivelisse Martinez Quiles
(74) *Attorney, Agent, or Firm* — SBMC (57) ABSTRACT

A foldable device includes a first housing portion, a second housing portion, and a hinge structure joined therebetween to permit the foldable device to be folded along an axis between an open mode and a closed mode. Touch sensors are disposed along one or more of the first housing portion or the second housing portion. The device includes a module implemented at least partially in hardware and configured to: determine touch sensor physical proximity; responsive to the touch sensor physical proximity not being less than a threshold, determine that the foldable device is in the open mode and cause the foldable device to be operated in a single sensor mode; and responsive to the touch sensor physical proximity being less than the threshold, determine that the foldable device is in a closed mode and cause the foldable device to be operated in a cumulative sensor mode.

20 Claims, 8 Drawing Sheets

CUMULATIVE SENSOR IN A FOLDABLE DEVICE

BACKGROUND

The ever increasing popularity of mobile devices is well known. To drive this popularity, the functionality incorporated as part of the mobile devices continues to expand. One example of this is incorporation of a flexible display device that allows a user to fold the display device and even a housing of the mobile device to assume a variety of different viewing modes.

Challenges continue to be posed to those who design such devices to provide an enhanced user experience through functionality that appreciates and leverages the foldability of such devices.

BRIEF DESCRIPTION OF THE DRAWINGS

Implementations of determining spatial relationships between housings of a mobile device are described with reference to the following drawings. The same numbers are used throughout the drawings to reference like features and components.

DETAILED DESCRIPTION

A mobile device is foldable, along at least one axis, to provide different viewing modes. The viewing modes can include an open mode in which the mobile device is not folded, and a closed mode in which the mobile device is folded along at least one axis. In at least some implementations, the closed mode can result from the device being inwardly folded or outwardly folded.

In at least some implementations, the mobile device includes sensors on the device. The sensors can include any suitable type of sensors such as, by way of example and not limitation, force sensors, touch sensors, inductive sensors, capacitive sensors, and the like. When the mobile device is changed from one viewing mode to another, as by being changed from the open mode to the closed mode or vice versa, the relative distance between the device's sensors can change. Based on the viewing mode change, the sensor behavior and functionality can be modified to provide enhanced contextual interaction with the device. For example, when in the open mode, the device may have multiple sensors spatially distributed along each side of the device. When, however, the device is closed, sensors that were formerly spatially distributed along one side may now be touching or closely adjacent one another such that the sensors may be considered as "combined" or "cumulative". This provides various opportunities for designers of such mobile devices to enhance the user's experience.

For example, one opportunity is that different sets of functionality may be mapped to different sensors depending on the viewing mode. That is, when the device is in the open mode, one set of functionalities can be mapped to each of the sensors. When, however, the device is placed into the closed mode, a set of different functionalities can now be mapped to the combined or cumulative sensors. Alternately or additionally, various new gestures are now possible by virtue of the fact that the device is foldable, as will become apparent below.

In various implementations, viewing mode determination sensors are used to precisely determine the various viewing modes. This can be done by detecting various distinct relationships between housing portions of the device as these housing portions are manipulated into different positions.

Any number of viewing mode determination sensors and types of sensors may be used to determine an orientation of the various housing portions. In one example, accelerometers are used to determine relative angles between various housing portions of the device. In another example, infrared (IR) sensors are used to determine relative proximity of one housing portion to another. Similarly, proximity sensors or light sensors may also be used to determine proximity of one housing portion to another. In a further example, a magnetometer within one housing portion is used to measure a relative feedback from a reference point in another housing portion to determine a relative distance between the sensor and the reference point.

The sensors described above are usable to determine a viewing mode of the device from the determination of the orientation of one housing portion in relation to another. Examples of viewing modes include an open mode such that a display of the device is completely exposed similar to a communication device such as a smart phone or a tablet, and a closed mode such that the device is folded, as by being folded in half, thirds, fourths, and the like.

The device may respond in a variety of different ways once a viewing mode is determined. For example, the device may enable functionality specific to the viewing mode by enabling, disabling, or changing a display mode of one or more display devices, or configuring which functionality is made available to a user by way of user input sensors as described above and below. When the device is manipulated into a different viewing mode, the device is able to determine the new viewing mode and change any functionality corresponding to the new viewing mode as further described below.

While features and concepts of determining spatial relationships between housings of a mobile device can be implemented in any number of different environments, systems, devices, and/or various modes, implementations of monitoring a mobile device mode are described in the context of the following example devices, systems, and configurations.

Example Environment

Figure 1:
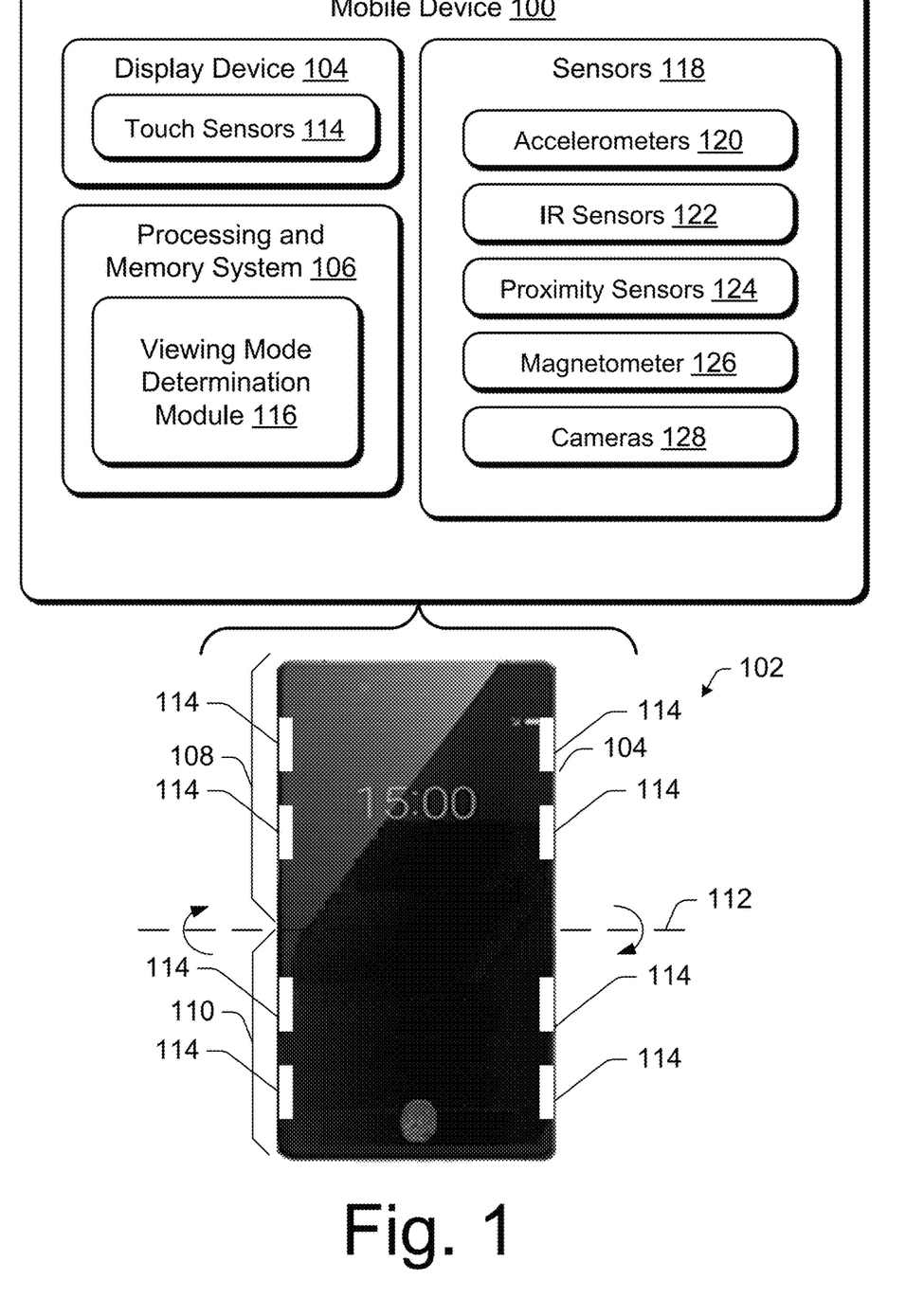
FIG. 1 illustrates various components of a mobile device in an open viewing mode including some of the sensors that may be used to access device functionality in accordance with one or more implementations.

FIG. 1 illustrates an example of a mobile device 100 in accordance with one or more implementations. The mobile device 100 may assume a variety of configurations. One example is a mobile phone or tablet in which the open mode 102 causes the entire display device 104, in this case a front display device, to be viewable to a user of the device. Other examples are also possible, including use of the open mode 102 when the mobile device 100 is configured as a "wearable", such as to be worn on a wrist of a user, as a pendant, as glasses, goggles, and so forth. Display device 104 may also include a rear display device located on the opposite side of the depicted device. In many instances, the display device may wrap around the edges of the housing so as to enable sensors to provide virtual buttons or other means by which a user may provide touch input, as by gripping the device and using the thumb and fingers to provide input to the sensors.

The mobile device 100 includes a processing and memory system 106 that is representative of functionality to execute instructions, such as to cause output of a user interface on the display device 104. The processing and memory system 106 may be implemented in a variety of ways, including as dedicated integrated circuits, fixed hardware, and so forth as further described in relation to FIG. 8.

The mobile device 100 is configured to include a plurality of housing portions, examples of which include a first housing portion 108 and a second housing portion 110 that are joined together by a flex structure, e.g., a flexible hinge, that permits folding of the device along an axis 112 to change the viewing mode of the device. Any suitable type of hinge structure can be used. In some implementations, the hinge structure is a dual purpose hinge structure which not only joins the housing portions together, but also serves as a sensor for receiving touch input from a user.

As noted, the flex structure is configured to support positioning of the first and second housing portions 108, 110 in a variety of different orientations to support a variety of viewing modes. The first and second housing portions 108, 110 may be configured in a variety of ways, such as fixed structures (e.g., formed out of a metal and/or plastic) that are not flexible and instead rely on the flex structure as a separate device to both join the housings and enable the different viewing modes. In another example, the flex structure is incorporated as part of the first and second housing portions 108, 110 such that the portions are flexible along a plurality of points, e.g., orthogonal to a longitudinal axis of the display device 104. Although the device is described with two portions, any number of portions can be implemented and connected via suitable flex structures or a plurality of such structures without departing from the scope of the description contained herein, such as a device that is foldable along two axes, three axes, and more.

The display device 104 may also be configured to bend in any number of locations e.g., as a flexible OLED screen. The display device 104 may also incorporate a touchscreen or touch sensitive functionality through incorporation of touch sensors as illustrated diagrammatically at 114. Any suitable number of touch sensors may be employed. The touch sensors can be implemented as any suitable type of touch sensors such as force sensors, capacitive sensors, inductive sensors, and the like.

The mobile device 100 also includes a viewing mode determination module 116 that is implemented, in at least some examples, at least partially in hardware, e.g., through use of the processing and memory system 106. The viewing mode determination module 116 is representative of logic to determine a viewing mode based on a detected orientation and disposition of the housing portions (e.g., the first and second portions 108, 110) in relation to each other.

In order to determine the viewing mode, the viewing mode determination module 116 leverages signals received from sensors 118 of the mobile device 110 that are incorporated as part of the first and second portions 108, 110. Signals received from the sensors 118, for instance, may be compared to determine an orientation and likely positioning of the portions in space and, from this, a likely viewing mode. The viewing mode determination module 116 may also include functionality to verify signals received from one of the sensors 118 using another one of the sensors 118 as further described in the following.

Examples of sensors 118 include, by way of example and not limitation, accelerometers 120, infrared (IR) sensors 122, proximity sensors 124, and magnetometers 126 although other examples may also be employed, such as to leverage forward or rear facing cameras 128 of the mobile device 100, as described below in more detail. These sensors 118 may be used in a variety of different ways by the viewing mode determination module 116 to address particular functionality of the sensors to determine a spatial relationship and orientation of the housings.

The accelerometers 120, for instance, may include a first and second accelerometer that are disposed at opposite ends of the housing portions, e.g., at opposing ends of the first and second housing portions 108, 110. To calculate a relative angle between the first housing portion 108 and the second housing portion 110, inputs from the first accelerometer and the second accelerometer are compared. The relative angle is based on differences in readings of the two accelerometers (e.g., an axis detected by each of the sensors) to determine the relative angle between the first housing portion 108 and the second housing portion 110. In an implementation, the same axis of each of the two accelerometers is positioned such that the axis for the first accelerometer and the second accelerometer read positive towards the "top" of the device in the open viewing mode 102, e.g., point up toward the display device 104. Based on the relative angle between these axes, the viewing mode can be ascertained. For the following discussion, a first accelerometer x-axis is referred to as a "first x-axis" and a second accelerometer x-axis is referred to as a "second x-axis". So, for example, while the device is in the open viewing mode 102, the first x-axis and the second x-axis of the first and second accelerometers read a relative angle of approximately zero degrees. When, however, the device is in the closed viewing mode, the relative angle between these axes is different, e.g. 180-degrees.

Other sensors may also be employed by the viewing mode determination module 116 to further determine the open mode 102 or verify the determined open mode 102. The IR sensors 122, for instance, may include individual or pairs of first and second IR sensors that are disposed at opposing ends of the structure formed by the plurality of portions, e.g., at opposing ends of the first and second portions 108, 110. While the device is in the open mode 102, the first and second IR sensors read minimum values because the first and second portions 108, 110 are not occluding the IR sensors. When, however, the device is closed, the first and second IR sensors read different values which can be attributed to the closed mode.

The proximity sensors 124 may also be used to determine a likelihood that the mobile device 100 is oriented in the illustrated open mode. In this example, the illustrated open mode 102 includes a proximity sensor disposed at an end of the structure formed by the plurality of portions, e.g., at one end of the first housing portion 108. The proximity sensor may also comprise a light sensor that is able to detect proximity of an object, e.g., the second housing portion 110. While the device is in the open mode 102, the proximity sensor 124 reads a minimum value because the first and second portions 108, 110 do not occlude the proximity sensor. When, however, the device is closed, the proximity sensor 124 reads a different value because of the occlusion.

In another example, the magnetometer 126 is implemented in the open mode 102 as a magnetometer disposed at an end of the structure formed by the housing portions. The magnetometer may determine an amount of feedback coming from a magnetometer reference disposed at an end of the structure formed by the housing portions. The magnetometer reference may be a screw or any other piece of metal that can be used as a reference point for detection by the magnetometer. The magnetometer may measure Teslas, and for example, may read a higher level of Teslas if the second housing portion 110 is folded towards or placed closer to the first housing portion 108 due to a decreased distance between the magnetometer 126 and the magnetometer reference. On the other hand, while the device is in the open mode 102, the magnetometer reads a minimum value due to the magnetometer reference being at a farthest point from the magnetometer compared with other viewing modes.

Figure 2:
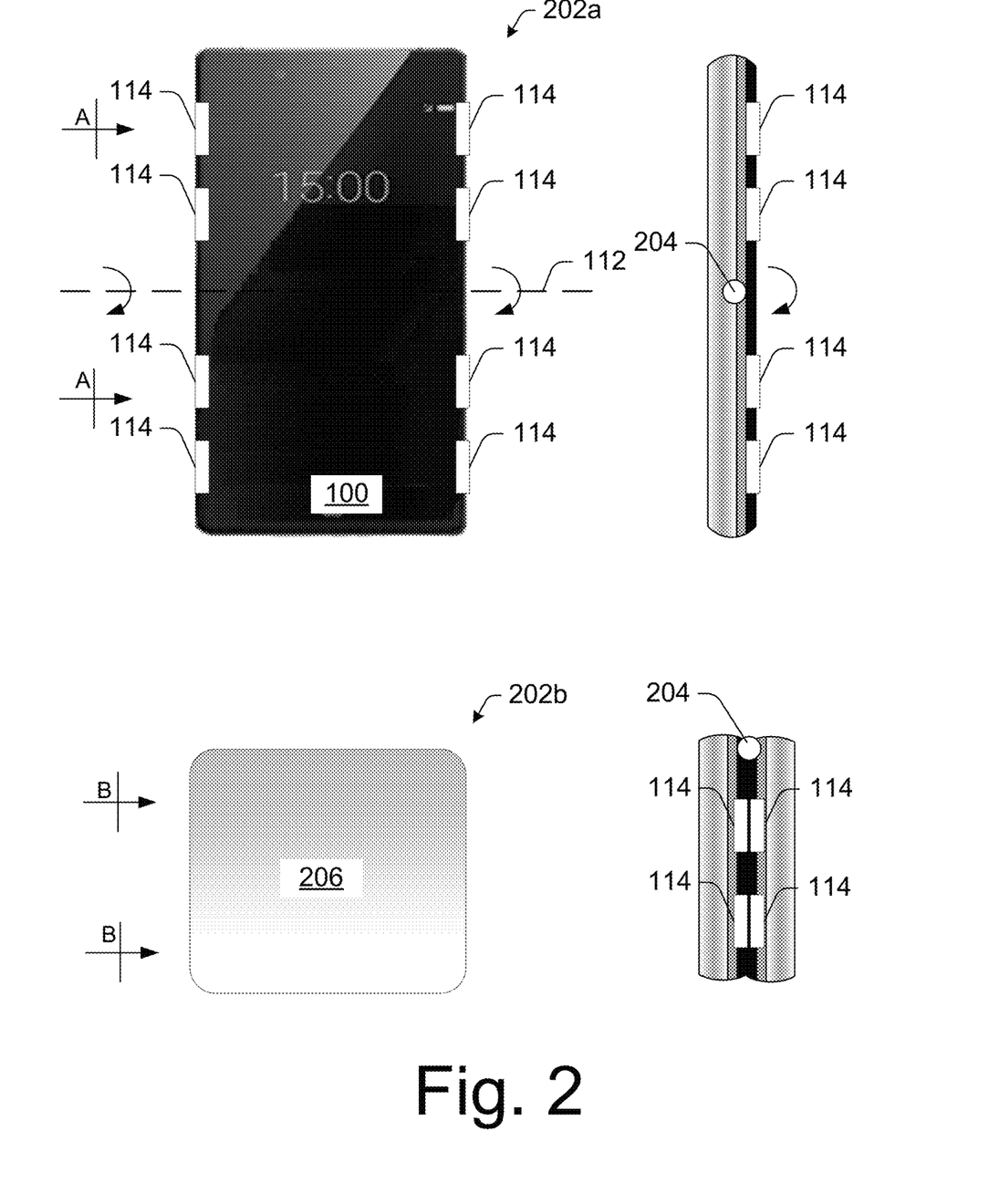
FIG. 2 illustrates an example of the mobile device in both an open viewing mode and a closed viewing mode in accordance with one or more implementations.

FIG. 2 illustrates the mobile device in an open mode 202a and a closed mode 202b where the device has been folded along axis 112 by way of hinge structure 204. In the open mode 202a, the front display device is clearly visible along with corresponding touch sensors 114. To the right of the illustrated open mode 202a, the mobile device is shown in a side view taken along line A-A. Similarly, to the right of the illustrated closed mode 202b, the mobile device is shown in a side view taken along line B-B. In the closed mode, a rear display device this shown at 206. An enlarged view of the sensors 114 of the side views taken along lines A-A and B-B is shown in FIG. 3.

Figure 3:
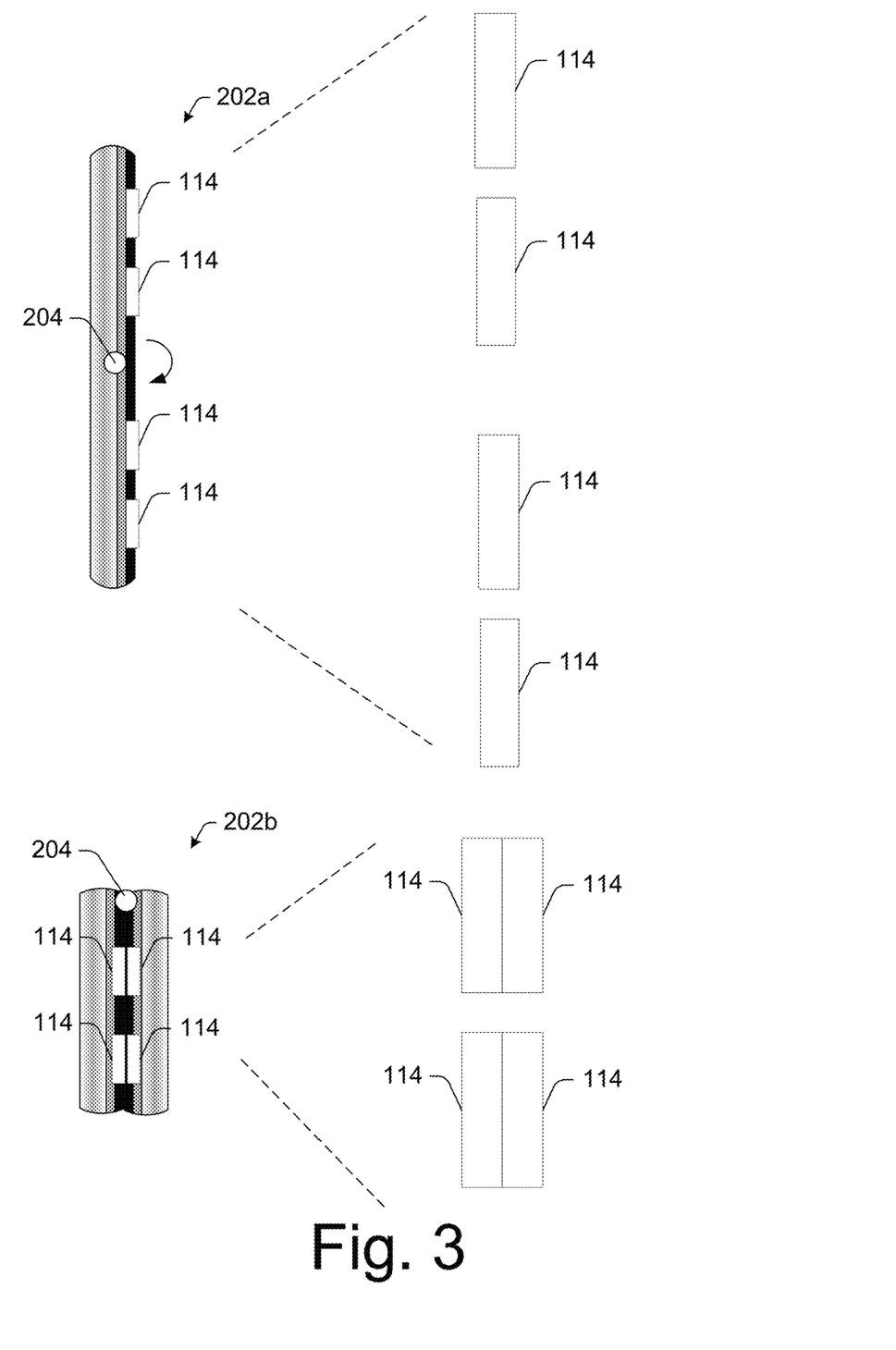
FIG. 3 illustrates an example of the mobile device in an open viewing mode and a closed viewing mode, along with various touch sensors in accordance with one or more implementations.

Notice, in both FIGS. 2 and 3, that when the mobile device is changed from the open mode 202a to the closed mode 202b, the relative distance between touch sensors 114 changes. Specifically, and as perhaps best illustrated in the corresponding side views taken along lines A-A and B-B, respectively, in the open mode, the touch sensors are spatially distributed along the side of the device in a linear fashion. When, however, the device is closed as illustrated in side view B-B, sensors that were formerly spatially distributed along one side of the device are now closely adjacent or touching one another so as to form a combined or cumulative sensor. In this particular instance, in the open mode, each touch sensor has an area that corresponds to X/Y coordinates. In at least some implementations, each touch sensor can be mapped to different functionality. Alternately or additionally, each touch sensor can recognize certain gestures that enable access to various functionality.

In the closed mode, as perhaps best illustrated in FIG. 3, each combined sensor has a larger area, in this case twice the area of a single touch sensor, and a set of corresponding X/Y coordinates which are combined to provide a larger combined touch sensor. In at least some implementations, each combined touch sensor can be mapped to functionality that is different from the functionality that its individual constituent touch sensors were formerly mapped to in the open mode. Alternately or additionally, each combined touch sensor can recognize different gestures than were recognized by the individual constituent touch sensors when the device was in the open mode. As an example, consider FIG. 4.

Figure 4:
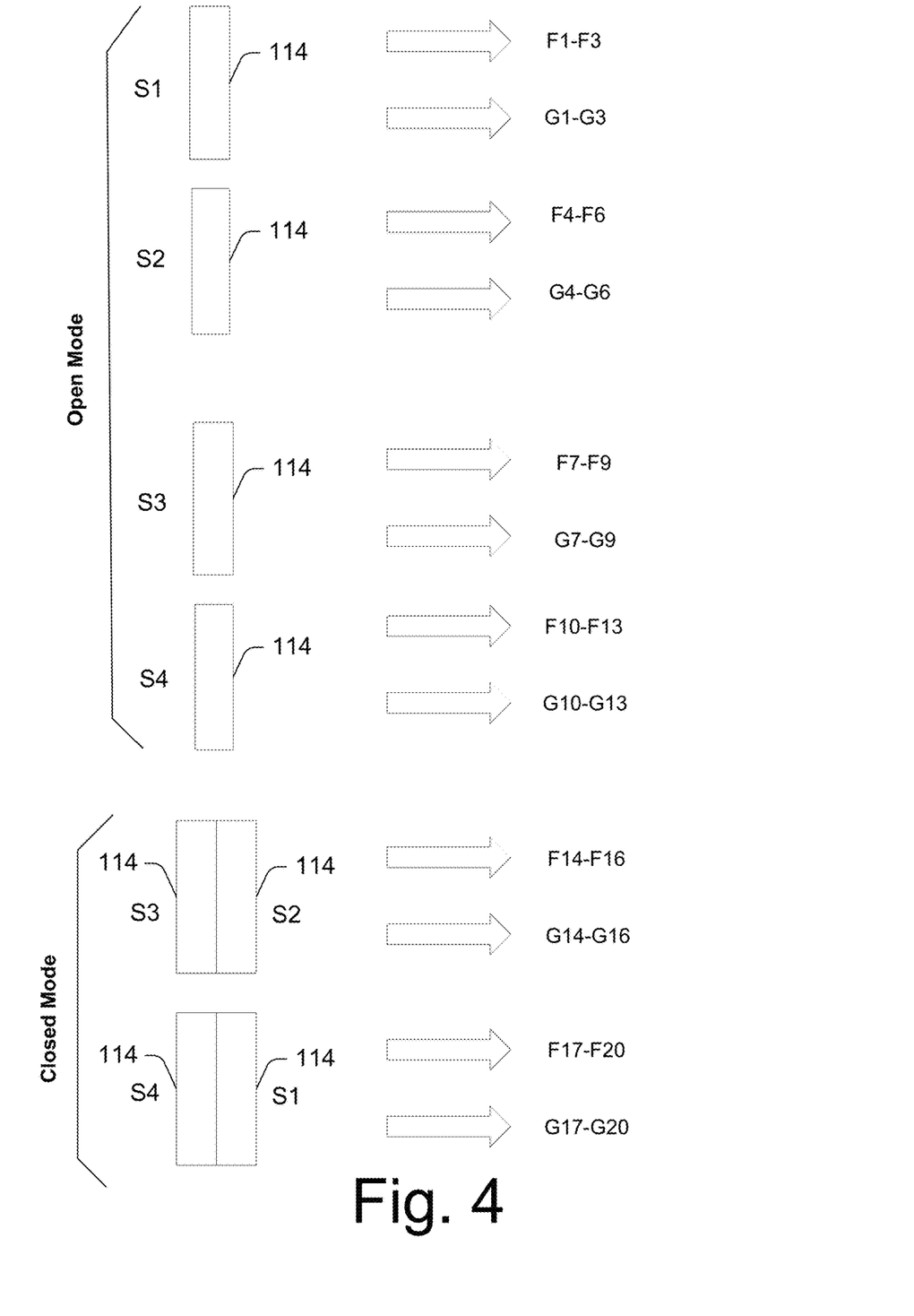
FIG. 4 illustrates an example of the mobile device and how different touch sensors can be used to mapped to different functionalities and/or gestures in accordance with one or more implementations.

There, the touch sensors 114 are diagrammatically illustrated in both the open mode and the closed mode. In this particular instance, the sensors are designated S1, S2, S3, and S4. In the open mode, the sensors are aligned serially from S1 to S4. In the closed mode, however, sensors S2 and S3 form a first combined or cumulative sensor, and sensors S1 and S4 form a second combined or cumulative sensor. In this particular example, in the open mode (also referred to as the "single sensor mode" in the discussion of the flow diagram of FIG. 7), sensor S1 can be mapped to functionality that is designated F1-F3. Similarly, sensor S1 can be mapped to certain gestures, here designated G1-G3. Likewise, sensors S2, S3, and S4 can be mapped to the illustrated functionalities and/or gestures. When the mobile device is placed in the closed mode (also referred to as the "cumulative sensor mode" in the discussion of the flow diagram of FIG. 7), the combined sensors can be mapped to different functionalities and/or different gestures. For example, the combined sensor formed from sensors S2 and S3 can be mapped to functionalities designated F14-F16 and/or gestures designated G14-G16. Likewise, the combined sensor formed from sensors S1 and S4 can be mapped to functionalities designated F17-F20 and/or gestures G17-G20.

For example, with a combined sensor, new gestures can be based on the order in which contact is made with the individual constituent sensors. Consider, for example, combined sensor S2/S3. A first gesture might be based on a contact order in which sensor S2 receives the first contact and sensor S3 receives the second contact. Such might be the case in the presence of a swiping gesture. In turn, this new gesture which flows from the combined sensor may enable access to a first functionality. At the same time, a second gesture might be based on a contact order in which sensor S3 receives the first contact and sensor S2 receives the second contact. In this case, the different order in which the gesture is performed may enable access to a second different functionality.

Figure 5:
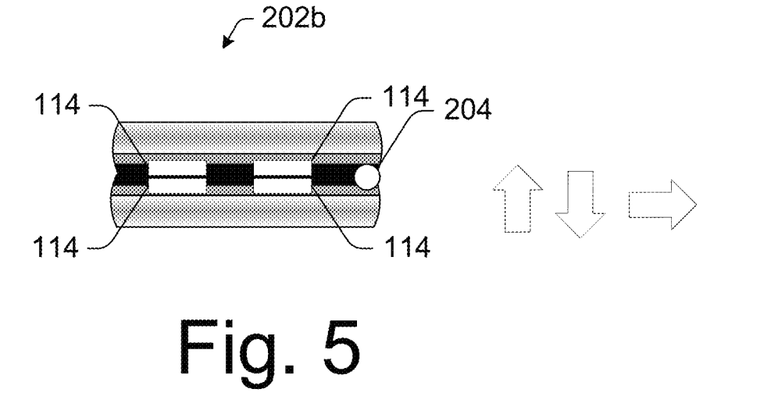
FIG. 5 illustrates an example of the mobile device and one gesture when the mobile device is in the closed mode in accordance with one or more implementations.

In addition, in implementations in which the hinge structure serves a dual purpose as not only a hinge but also a touch sensor, new collections of gestures can be defined to access even more functionality. As an example, consider FIG. 5. There, a new gesture that utilizes hinge structure 204 might include an up-down-swipe movement where the swipe movement passes over and touch-engages the hinge structure 204.

In this manner, the mobile device is more efficient by virtue of exposing different functionalities and/or enabling new and different collections of gestures depending on whether the device is in the open or closed mode. This, in turn, can enhance the user's experience by enabling access to functionality that was previously not possible in connection with foldable devices.

Example System

Figure 6:
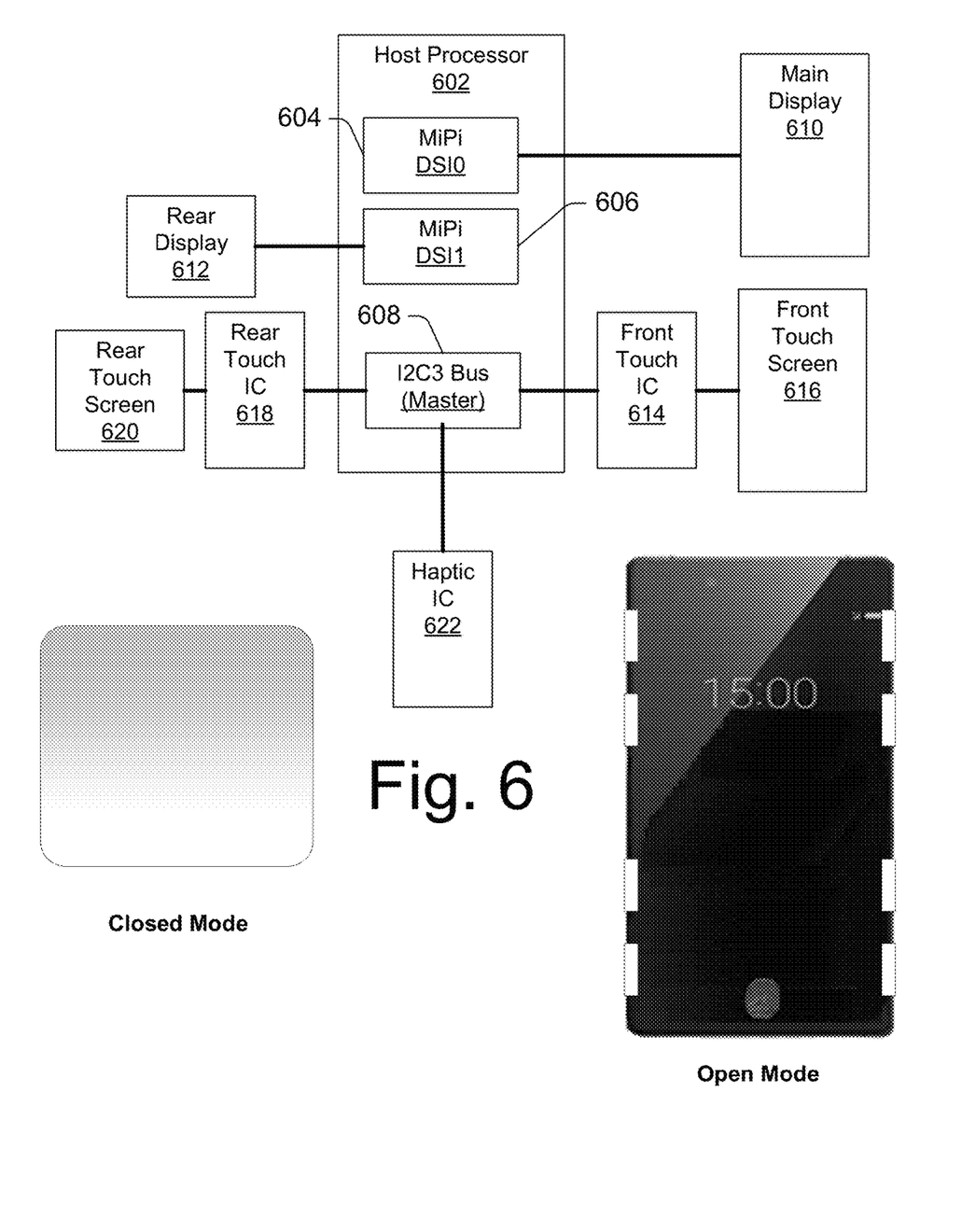
FIG. 6 illustrates an example system that can enable the mobile device to operate in the open and closed mode in accordance with one or more implementations.

FIG. 6 illustrates various components of an example system 600 implemented as any type of mobile computing and/or communication device, wearable device, a portable device, electronic device, appliance device, media device, consumer device, gaming device, and/or the mobile computer device as described with reference to FIG. 1 for implementations of a cumulative sensor in a foldable mobile device In this particular example, system 600 includes a host processor 602 that includes first and second MiPi Display Serial Interfaces 604, 606 and a bus 608. As will be appreciated by the skilled artisan, the MiPi Display Serial Interfaces define a high-speed serial interface between host processor 602 and a display module. In this case, MiPi Display Serial Interface 604 interfaces with main or front display 610, and MiPi Display Serial Interface 606 interfaces with rear display 612.

In one or more implementations, bus 608 is implemented as an I2C3 bus which serves as a master and provides robust communication between a front touch integrated circuit 614, a rear touch integrated circuit 618, and a haptic integrated circuit 622. The front touch integrated circuit 614 is operably connected to a front touch screen 616 and the rear touch integrated circuit 618 is operably connected to a rear touch screen 620. In this particular example, touch sensing is performed using capacitive sensing. Thus, front touch integrated circuit 614 and front touch screen 616 form a capacitive sensing module, as does rear touch integrated circuit 618 and rear touch screen 620. It is to be appreciated and understood, however, that sensing can be performed in any suitable way including, by way of example and not limitation, inductive sensing, force sensing, and the like.

Thus, when the mobile device is in the open mode, front touch integrated circuit 614 and front touch screen 616 enable touch input, including gestures, to be recognized by the touch sensors. Likewise, when the mobile device is in the closed mode, rear touch integrated circuit 618 and rear touch screen 620 enable touch input, including gestures, to be recognized by the combined touch sensors as described above.

Example Procedures

Figure 7:
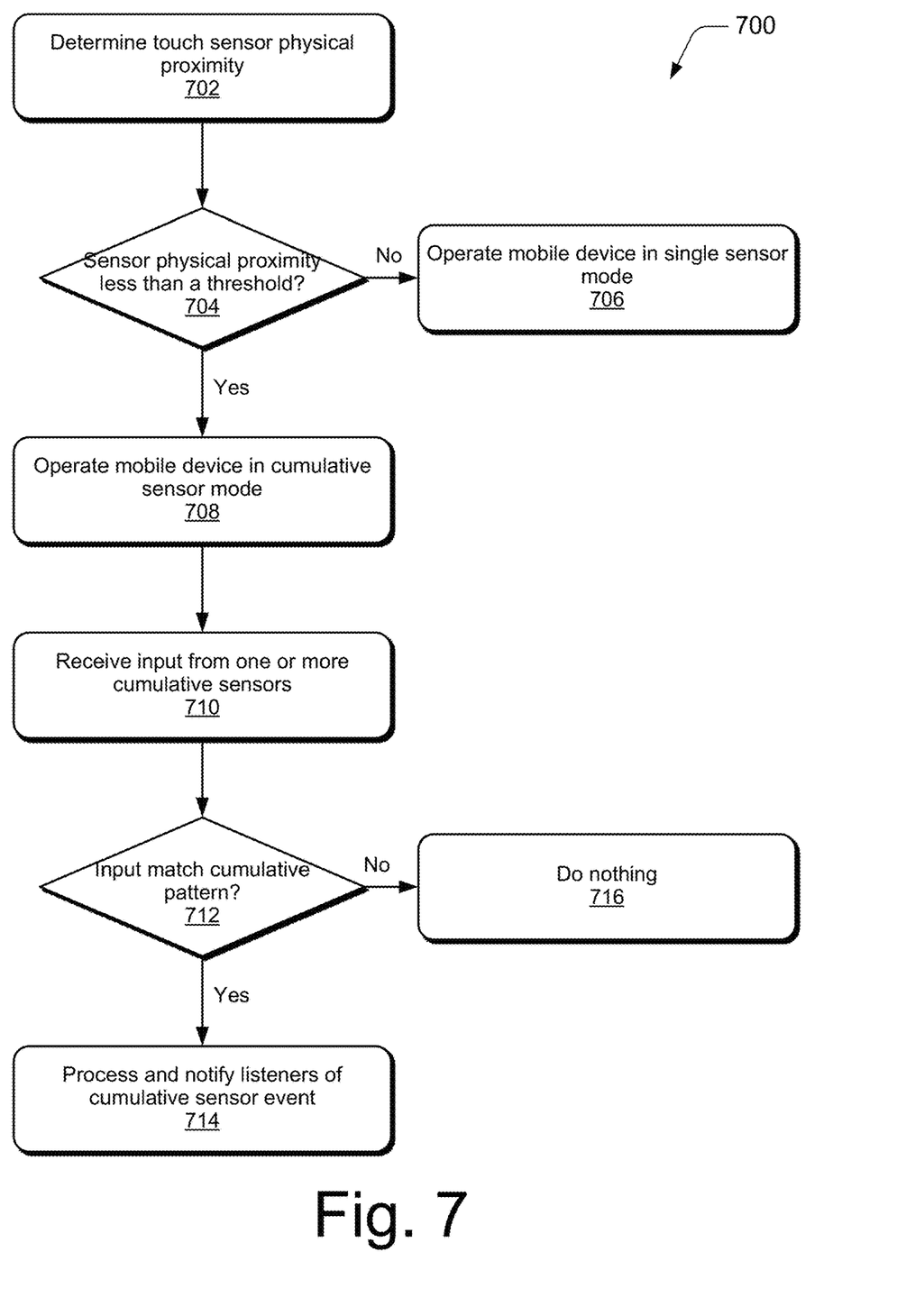
FIG. 7 illustrates a method in accordance with one or more implementations.

FIG. 7 illustrates example procedures for determining a viewing mode of the mobile device 100 using the sensors described above. Aspects of these methods may be implemented in hardware, firmware, software, or any combination thereof. The methods are shown as a set of blocks that specify operations performed by one or more devices, as illustrated and discussed with reference to FIG. 6. The operations are not necessarily limited to the orders shown for performing the operations by the respective blocks. Further, performance of these operations is not limited to the example system. Accordingly, the following discussion is arranged as including a description of the system and procedures in parallel.

FIG. 7 illustrates an example procedure 700 for determining a viewing mode of the mobile device using viewing mode determination module 116. At block 702, the viewing mode determination module 116 determines touch sensor physical proximity. Any suitable techniques can be utilized to determine touch sensor physical proximity. For example, as described above, various types of sensors can be used to determine the proximity of the touch sensors such as, by way of example and not limitation, accelerometers, infrared sensors, proximity sensors, magnetometers, an accelerometer/gyroscope combination, cameras, and the like.

At block 704, if the sensor physical proximity is not less than a threshold (i.e. the "no" branch), the viewing mode determination module determines that the mobile device is in the open mode and causes, at block 706, the mobile device to be operated in a single sensor mode. If, on the other hand, the sensor physical proximity is less than a threshold (i.e. the "yes" branch), the viewing mode determination module determines that the mobile device is in the closed mode and causes, at block 708, the mobile device to be operated in a cumulative sensor mode. In the cumulative sensor mode, sensors are combined for purposes of receiving user input as described above.

At block 710, input is received from one or more cumulative sensors. At block 712, the mobile device determines whether the received input matches one or more cumulative patterns. Cumulative patterns can be defined by one or more gestures such as a "up-down-swipe right" gesture. If the input matches a cumulative pattern, the input is processed at block 714 and, in at least some implementations, any listeners that have registered for notification in the presence of such pattern can be notified of the cumulative sensor event. This can permit the registered listener to cause the functionality associated with the matching input to be performed. If, on the other hand, the input does not match a cumulative pattern, the device does nothing at block 716 and can return to block 708 and continue to operate in the cumulative sensor mode until the condition defined at block 704 changes (i.e. the state of the mobile device changes from open mode to closed mode or vice versa).

Example Device

Figure 8:
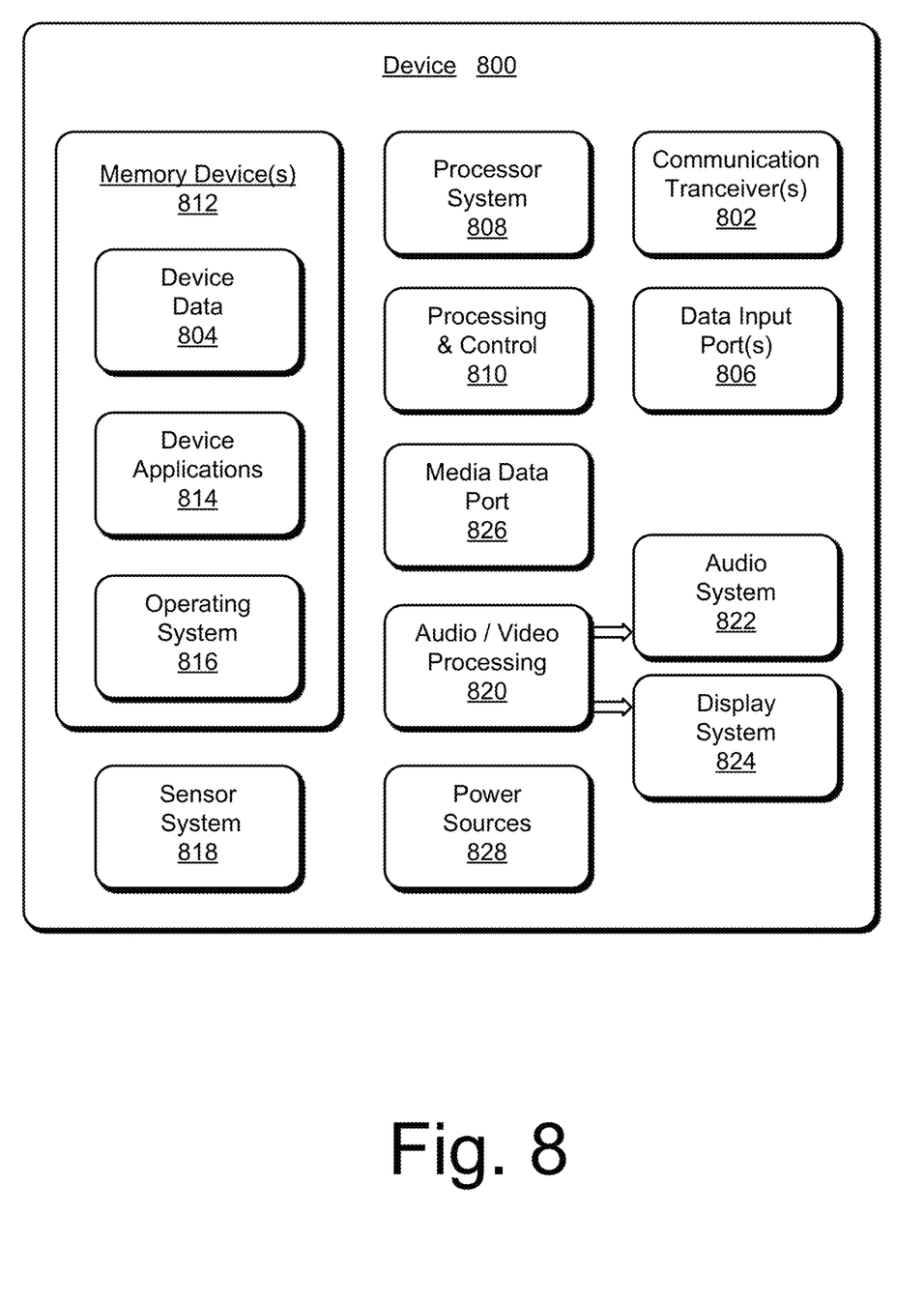
FIG. 8 illustrates an example device that can operate in both the open and closed mode in accordance with one or more implementations.

FIG. 8 illustrates various components of an example device 800 in which cumulative sensor embodiments in a foldable device can be implemented. The example device 800 can be implemented as any of the computing devices described with reference to FIGS. 1-3, such as any type of client device, mobile phone, tablet, computing, communication, entertainment, gaming, media playback, and/or other type of device. For example, the mobile device 100 shown in FIG. 1 may be implemented as the example device 800.

The device 800 includes communication transceivers 802 that enable wired and/or wireless communication of device data 804 with other devices. Additionally, the device data can include any type of audio, video, and/or image data. Example transceivers include wireless personal area network (WPAN) radios compliant with various IEEE 802.15 (Bluetooth™) standards, wireless local area network (WLAN) radios compliant with any of the various IEEE 802.11 (WiFi™) standards, wireless wide area network (WWAN) radios for cellular phone communication, wireless metropolitan area network (WMAN) radios compliant with various IEEE 802.15 (WiMAX™) standards, and wired local area network (LAN) Ethernet transceivers for network data communication.

The device 800 may also include one or more data input ports 806 via which any type of data, media content, and/or inputs can be received, such as user-selectable inputs to the device, messages, music, television content, recorded content, and any other type of audio, video, and/or image data received from any content and/or data source. The data input ports may include USB ports, coaxial cable ports, and other serial or parallel connectors (including internal connectors) for flash memory, DVDs, CDs, and the like. These data input ports may be used to couple the device to any type of components, peripherals, or accessories such as microphones and/or cameras.

The device 800 includes a processing system 808 of one or more processors (e.g., any of microprocessors, controllers, and the like) and/or a processor and memory system implemented as a system-on-chip (SoC) that processes computer-executable instructions. The processor system may be implemented at least partially in hardware, which can include components of an integrated circuit or on-chip system, an application-specific integrated circuit (ASIC), a field-programmable gate array (FPGA), a complex programmable logic device (CPLD), and other implementations in silicon and/or other hardware. Alternatively or in addition, the device can be implemented with any one or combination of software, hardware, firmware, or fixed logic circuitry that is implemented in connection with processing and control circuits, which are generally identified at 810. The device 800 may further include any type of a system bus or other data and command transfer system that couples the various components within the device. A system bus can include any one or combination of different bus structures and architectures, as well as control and data lines.

The device 800 also includes computer-readable storage memory 812 that enable data storage, such as data storage devices that can be accessed by a computing device, and that provide persistent storage of data and executable instructions (e.g., software applications, programs, functions, and the like). Examples of the computer-readable storage memory 812 include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage media in various memory device configurations. The device 800 may also include a mass storage media device.

The computer-readable storage memory 812 provides data storage mechanisms to store the device data 804, other types of information and/or data, and various device applications 814 (e.g., software applications). For example, an operating system 816 can be maintained as software instructions with a memory device and executed by the processing system 808. The device applications may also include a device manager, such as any form of a control application, software application, signal-processing and control module, code that is native to a particular device, a hardware abstraction layer for a particular device, and so on. In this example, the device 800 includes a sensor system 818 that implements embodiments of determining spatial relationships between housing portions of a mobile device, and may be implemented with hardware components and/or in software, such as when the device 800 is implemented as the mobile device 100 described above. An example of the sensor system 818 are the sensors 118 that are implemented by the mobile device 100.

The device 800 also includes an audio and/or video processing system 820 that generates audio data for an audio system 822 and/or generates display data for a display system 824. The audio system and/or the display system may include any devices that process, display, and/or otherwise render audio, video, display, and/or image data. Display data and audio signals can be communicated to an audio component and/or to a display component via an RF (radio frequency) link, S-video link, HDMI (high-definition multimedia interface), composite video link, component video link, DVI (digital video interface), analog audio connection, or other similar communication link, such as media data port 826. In implementations, the audio system and/or the display system are integrated components of the example device. Alternatively, the audio system and/or the display system are external, peripheral components to the example device.

The device 800 can also include one or more power sources 828, such as when the device is implemented as a mobile device. The power sources may include a charging and/or power system, and can be implemented as a flexible strip battery, a rechargeable battery, a charged super-capacitor, and/or any other type of active or passive power source.

Although embodiments have been described in language specific to features and/or methods, the subject of the appended claims is not necessarily limited to the specific features or methods described. Rather, the specific features and methods are disclosed as example implementations, and other equivalent features and methods are intended to be within the scope of the appended claims. Further, various different embodiments are described and it is to be appreciated that each described embodiment can be implemented independently or in connection with one or more other described embodiments.

What is claimed is:

1. A foldable device comprising:
a first housing portion;
a second housing portion;
a hinge structure joined to the first housing portion and the second housing portion to permit the foldable device to be folded along an axis between an open mode and a closed mode, wherein the hinge structure is configured as a touch sensor;
a plurality of touch sensors disposed along the first housing portion and the second housing portion;
a module implemented at least partially in hardware and configured to:
determine touch sensor physical proximity between the plurality of touch sensors disposed along the first housing portion and the second housing portion;
responsive to the touch sensor physical proximity not being less than a threshold, determine that the foldable device is in the open mode and cause the foldable device to be operated in a single sensor mode; and
responsive to the touch sensor physical proximity being less than the threshold, determine that the foldable device is in the closed mode and cause the foldable device to be operated in a cumulative sensor mode, wherein the cumulative sensor mode corresponds to at least two touch sensors of the plurality of touch sensors other than the hinge structure being combined and mapped to one or more gestures, wherein at least one gesture of the one or more gestures utilizes the hinge structure.

2. The foldable device of claim 1, wherein:
the single sensor mode corresponds to at least two touch sensors of the plurality of touch sensors being mapped to respective functionalities; and
the cumulative sensor mode corresponds to the at least two touch sensors of the plurality of touch sensors being combined and mapped to one or more functionalities that are different than the respective functionalities.

3. The foldable device of claim 1, wherein:
the single sensor mode corresponds to at least two touch sensors of the plurality of touch sensors being mapped to one or more respective gestures; and
the cumulative sensor mode corresponds to the at least two touch sensors of the plurality of touch sensors being combined and mapped to one or more gestures that are different than the one or more respective gestures.

4. The foldable device of claim 1, wherein:
the single sensor mode corresponds to at least two touch sensors of the plurality of touch sensors being mapped to respective functionalities; and
the cumulative sensor mode corresponds to the at least two touch sensors of the plurality of touch sensors being combined and mapped to one or more functionalities that are different than the respective functionalities; and wherein:
the single sensor mode corresponds to the at least two touch sensors of the plurality of touch sensors being mapped to one or more respective gestures; and
the cumulative sensor mode corresponds to the at least two touch sensors of the plurality of touch sensors being combined and mapped to one or more gestures that are different than the one or more respective gestures.

5. The foldable device of claim 1, the closed mode resulting from the foldable device being inwardly folded.

6. A foldable device comprising:
a first housing portion;
a second housing portion;
a hinge structure joined to the first housing portion and the second housing portion to permit the foldable device to be folded along an axis between an open mode and a closed mode, wherein the hinge structure is configured as a touch sensor;
a plurality of touch sensors disposed along the first housing portion and the second housing portion;
a module implemented at least partially in hardware and configured to:
receive touch input from one or more cumulative sensors on the foldable device, a cumulative sensor resulting, when said foldable device is folded along the axis into the closed mode, from a combination of individual touch sensors of the plurality of touch sensors disposed along the first housing portion and the second housing portion when the foldable device is in the open mode;
determine whether the received touch input matches a cumulative pattern defined by a gesture that utilizes the hinge structure;
responsive to the received touch input matching the cumulative pattern, process the received touch input to provide access to functionality associated with the gesture.

7. The foldable device as described in claim 6, wherein when the foldable device is in the open mode, said individual touch sensors of the plurality of touch sensors are mapped to functionality that is different than said functionality associated with said gesture.

8. The foldable device as described in claim 6, wherein when the foldable device is in the open mode, said individual touch sensors of the plurality of touch sensors are mapped to gestures that are different from said gesture.

9. The foldable device as described in claim 6, wherein when the foldable device is in the open mode: said individual touch sensors of the plurality of touch sensors are mapped to functionality that is different than said functionality associated with said gesture; and said individual touch sensors of the plurality of touch sensors are mapped to gestures that are different from said gesture.

10. The foldable device as described in claim 6, the closed mode resulting from the foldable device being inwardly folded.

11. A foldable device comprising:
a first housing portion;
a second housing portion;
a hinge structure joined to the first housing portion and the second housing portion to permit the foldable device to be folded along an axis between an open mode and a closed mode;
a plurality of touch sensors disposed along the first housing portion and the second housing portion;
a module implemented at least partially in hardware and configured to:
receive touch input from one or more cumulative sensors on the foldable device, a cumulative sensor resulting, when said foldable device is folded along the axis into the closed mode, from a combination of individual touch sensors of the plurality of touch sensors disposed along the first housing portion and the second housing portion when the foldable device is in the open mode;
determine whether the received touch input matches a cumulative pattern defined by a gesture;
responsive to the received touch input matching the cumulative pattern, process the received touch input to provide access to functionality associated with the gesture, wherein processing the received touch input to provide access to the functionality comprises notifying one or more listeners that have registered for notification in presence of the cumulative pattern.

12. The foldable device as described in claim 11, wherein when the foldable device is in the open mode, said individual touch sensors of the plurality of touch sensors are mapped to functionality that is different than said functionality associated with said gesture.

13. The foldable device as described in claim 11, wherein when the foldable device is in the open mode, said individual touch sensors of the plurality of touch sensors are mapped to gestures that are different from said gesture.

14. The foldable device as described in claim 11, wherein when the foldable device is in the open mode: said individual touch sensors of the plurality of touch sensors are mapped to functionality that is different than said functionality associated with said gesture; and said individual sensors of the plurality of touch sensors are mapped to gestures that are different from said gesture.

15. A method comprising:
determining, on a foldable computing device, touch sensor physical proximity between at least two touch sensors disposed along a first housing portion and a second housing portion other than a hinge structure;
responsive to the touch sensor physical proximity not being less than a threshold, determining that the foldable computing device is in an open mode and causing the foldable computing device to be operated in a single sensor mode; and
responsive to the touch sensor physical proximity being less than the threshold, determining that the foldable computing device is in a closed mode and causing the foldable computing device to be operated in a cumulative sensor mode, wherein the closed mode corresponds to the foldable computing device being folded along an axis by way of the hinge structure that serves as a touch sensor, and the cumulative sensor mode corresponds to the at least two touch sensors other than the hinge structure being combined and mapped to one or more gestures, wherein at least one gesture of the one or more gestures utilizes the hinge structure.

16. The method as described in claim 15, wherein the closed mode corresponds to the foldable computing device being folded along a single axis.

17. The method as described in claim 15, wherein: the single sensor mode corresponds to the at least two touch sensors being mapped to respective functionalities; and the cumulative sensor mode corresponds to the at least two touch sensors being combined and mapped to one or more functionalities that are different than the respective functionalities.

18. The method as described in claim 15, wherein: the single sensor mode corresponds to the at least two touch sensors being mapped to one or more respective gestures; and the cumulative sensor mode corresponds to the at least two touch sensors being combined and mapped to one or more gestures that are different than the one or more respective gestures.

19. The method as described in claim 15, wherein: the single sensor mode corresponds to the at least two touch sensors being mapped to respective functionalities; and the cumulative sensor mode corresponds to the at least two touch sensors being combined and mapped to one or more functionalities that are different than the respective functionalities; and wherein the single sensor mode corresponds to the at least two touch sensors being mapped to one or more respective gestures; and the cumulative sensor mode corresponds to the at least two touch sensors being combined and mapped to one or more gestures that are different than the one or more respective gestures.

20. The method as described in claim 15, the closed mode resulting from the foldable device being inwardly folded.

\* \* \* \* \*